United States Patent [19]
Daubenspeck et al.

[11] Patent Number: 5,609,772
[45] Date of Patent: Mar. 11, 1997

[54] CUBE MASKLESS LEAD OPEN PROCESS USING CHEMICAL MECHANICAL POLISH/LEAD-TIP EXPOSE PROCESS

[75] Inventors: Timothy H. Daubenspeck, Colchester; Steven J. Holmes, Milton; Thomas G. Ference, Essex Junction, all of Vt.

[73] Assignee: International Business Machines Corporation, Armonk, N.Y.

[21] Appl. No.: 463,537

[22] Filed: Jun. 5, 1995

[51] Int. Cl.$^6$ ............ C03C 15/00; C03C 25/06; C23F 1/00; B44C 1/22
[52] U.S. Cl. ............ 216/14; 216/16; 216/72; 437/208; 437/915; 437/228
[58] Field of Search ............ 216/14, 16, 72; 437/228 SE, 228 PE, 228 POL, 228 ST, 915, 208

[56] References Cited

U.S. PATENT DOCUMENTS

| | | | |
|---|---|---|---|
| 4,238,755 | 8/1981 | Tracy | 361/393 |
| 4,525,921 | 7/1985 | Carson et al. | 29/577 C |
| 4,672,737 | 6/1987 | Carson et al. | 29/572 |
| 4,770,640 | 9/1988 | Walter | 439/69 |
| 5,016,138 | 5/1991 | Woodman | 361/381 |
| 5,051,865 | 9/1991 | Kato | 361/386 |
| 5,107,586 | 4/1992 | Eichelberger et al. | 29/830 |
| 5,279,991 | 1/1994 | Minahan et al. | 437/208 |

OTHER PUBLICATIONS

Srinivasan Sivaram et al., Planarizing Interlevel Dielectrics by Chemical-Mechanical Polishing, May 1992.
Iqbal Ali et al., Chemical-mechanical polishing of interlayer dielectric: A review.

*Primary Examiner*—Richard L. Schilling
*Attorney, Agent, or Firm*—Schmeiser, Olsen & Watts; William D. Sabo

[57] ABSTRACT

A semi-conductor device having a conductive lead with an exposed tip disposed within a first insulative material, which is in turn disposed between insulated first and second integrated circuit chips is disclosed. The first insulative material is etched to form a recess after which a second insulative material is deposited on the access plane of the chips and within the recess. The tip of the wire lead is then exposed by either a chemical mechanical polish or by a wet etch/develop process.

11 Claims, 2 Drawing Sheets

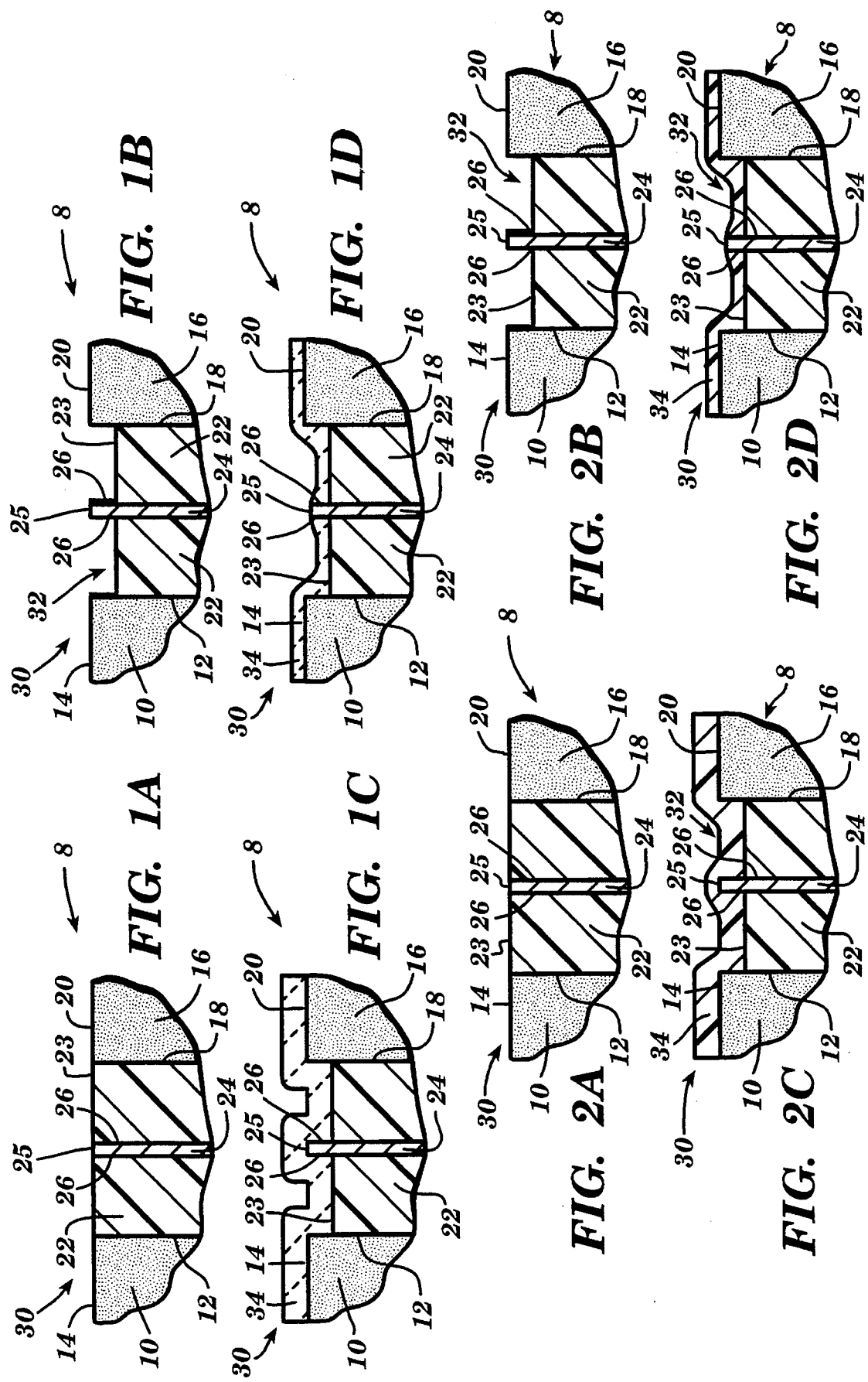

CUBE MASKLESS LEAD OPEN PROCESS USING CHEMICAL MECHANICAL POLISH/LEAD-TIP EXPOSE PROCESS

BACKGROUND OF THE INVENTION

1. Technical Field

This invention generally relates to semi-conductor processing. In particular, this invention relates to a die-to-die interconnection structure and a method for fabricating the structure for a stacked and laminated, three dimensional, semi-conductor device, commonly known as CUBE, so that wiring may be constructed on the face of the CUBE.

2. Background Art

The development of CUBE technology has created a need to completely insulate the access, or end plane edges, of the chips without covering the wire leads, which must be in electrical contact with the cube face wiring. Various methods for insulating the cube face or access plane completely, except for the ends of the leads, are available including: (a) photolithographic methods of selectively etching holes or vias through a deposited insulating coating over the wire leads; and (b) photolithographic methods of selectively etching the access plane end of the stacked chips, depositing the insulative layer, and lapping in order to uncover the tips of the leads without removing the insulative layer from the edges of the silicon chips.

U.S. Pat. No. 4,525,921, entitled "High-Density Electronic Processing Package—Structure and Fabrication", by Carson et al., issued Jul. 2, 1985, and assigned to Irvine Sensors Corporation, relates to a stack of semi-conductor chips having circuitry on each chip and the method of fabricating the stacks, including the process for insulating the cube face, except for the ends of the leads. The method includes etching the silicon chips at the cube face, covering the cube face with insulative material, and then lapping to expose the ends of the wire leads. The etch of the cube face of the silicon chips and silicon oxide between the chips is accomplished by a plasma, or charged gas, reacting with photoresist-free substrate (i.e. the silicon chip and insulative material).

U.S. Pat. No. 5,107,586, entitled "Method for Interconnecting a Stack of Integrated Circuits at a Very High Density", by Eichelberger et al., issued Apr. 28, 1992, and assigned to General Electric Company, relates to a method for interconnecting stacks of chips by applying insulator film to the cube faces of the stack of chips and then photolithographically creating vias through the insulative layer, forming an interconnect pattern on top of the insulative layer and then electroplating the interconnect pattern.

As described in the above-cited patents, via etching by photo-lithographic means and silicon chip etching have been used as methods to allow the lead wires running along the chip's faces to be interconnected at the cube face while allowing insulation of the cube faces. See U.S. Pat. No. 4,238,755 (a multi-layered integrated circuit wherein the chips plug into a detector chip, the only insulative material between the chips and the detector chip is the atmosphere surrounding the chip); U.S. Pat. No. 4,627,737 (photo-detector array module having a stack of semi-conductor chips formed by the etch, insulate, lap method); U.S. Pat. No. 4,770,640 (electrical interconnection device for integrated circuits produced by a photolithographic method of selectively etching vias through the insulative coating); U.S. Pat. No. 5,016,138 (high density package for integrated circuits in which the chips are placed onto substrate layers of insulative material and then stacked); U.S. Pat. No. 5,051,865 (in a laminated stacked chip structure, the preparation for surface wire connection to the chip surface conductors by polishing back the surface of the structure); and U.S. Pat. No. 5,279,991 (method for fabricating stacks of integrated circuit chips by segmenting larger stacks accomplished by using a thermoplastic adhesive on the plane between the short stacks, no method specifically for insulating the cube face, except for the wire leads, is given). All of the references disclosed herein are hereby incorporated by reference.

The above references do not adequately address the problems involved with photolithographically defining and etching a via through the insulating coating, with the attendant increases in process time, unit hours, tooling, and CUBE build costs. Additionally, the present photolithographic processes may have metallization coverage problems over possibly discontinuous lead-tip/polyimide structures. Therefore, there existed a need to provide electrical contacts on the face of a CUBE without photolithographically defining and etching a via through the insulating coating or etching the access plane edge of the stacked chip, thereby degrading the chip itself.

SUMMARY OF THE INVENTION

According to the present invention, a semi-conductor device is disclosed having a conductive lead disposed within a first insulative material. The first insulative material is disposed between a first and second integrated circuit chip. The first insulative material is etched to form a recess. An insulative layer is disposed on the access plane of the chips and within the recess, but not on the end of the wire lead. A method is also disclosed for producing the semi-conductor device by selectively etching the insulative material without substantially etching the chips.

BRIEF DESCRIPTION OF DRAWINGS

The preferred exemplary embodiment of the present invention will hereinafter be described in conjunction with the appended drawings, where like designations denote like elements, and:

FIG. 1A is a fragmentary, cross-sectional view of the semi-conductor device of the present invention prior to processing;

FIG. 1B is a fragmentary, cross-sectional view of the semi-conductor device of the present invention after the $O_2$ plasma ash has been performed;

FIG. 1C is a fragmentary, cross-sectional view of the semi-conductor device of the present invention after the conformal insulative material has been applied;

FIG. 1D is a fragmentary, cross-sectional view of the semi-conductor device of the present invention after the chemical mechanical polish;

FIG. 2A is a fragmentary, cross-sectional view of the semi-conductor device of the present invention prior to processing;

FIG. 2B is a fragmentary, cross-sectional view of the semi-conductor device of the present invention after the $O_2$ plasma ash has been performed;

FIG. 2C is a fragmentary, cross-sectional view of the semi-conductor device of the present invention after the semi-planarizable insulative material has been applied;

FIG. 2D is a fragmentary, cross-sectional view of the semi-conductor device of the present invention after the wet etch/develop process;

BEST MODES FOR CARRYING OUT THE INVENTION

Figure 3A:
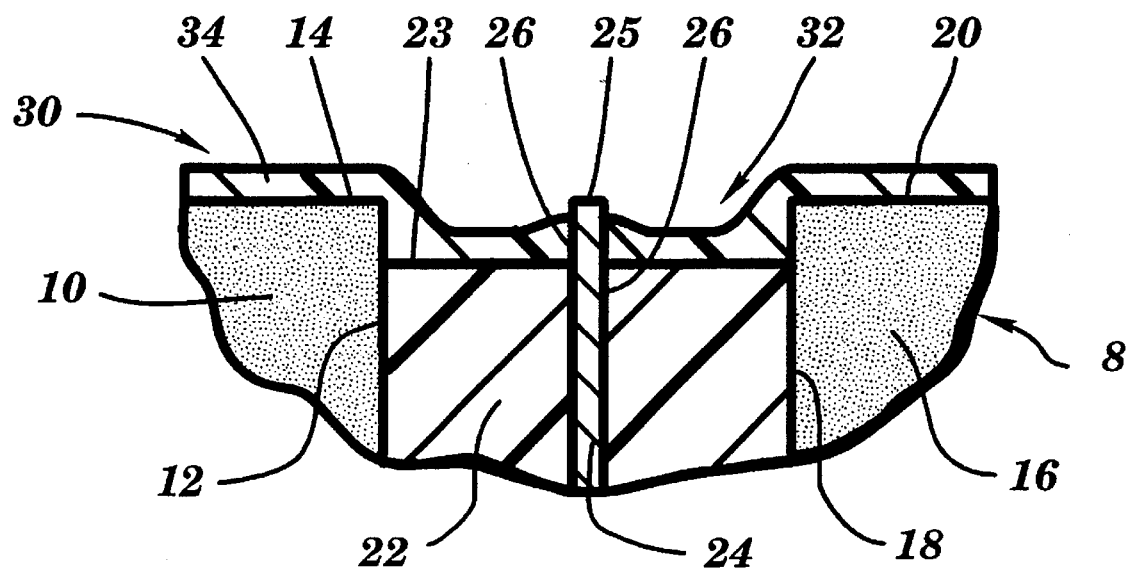
FIG. 3A is a fragmentary, cross-sectional view of the semi-conductor device of the present invention after the wet etch/develop process, showing a gap between the lead tip and the second insulative material.

Referring to FIGS. 1A–D, 2A–D, and 3A–B, there is shown a stepwise series of views of the semi-conductor device, designated generally herein as 8, that shows the device 8 in fragmentary cross-section at each step of the process described herein. The complete device 8 comprises at least one of a repeating unit, the basic unit being described in further detail hereinbelow.

As shown in FIG. 1A, there is provided a first integrated circuit chip 10 having a first chip face 12 and a first cube face 14. A second integrated circuit chip 16 is shown having a second chip face 18 and a second cube face 20. A first insulative material 22 having an exposed end 23 is disposed between the first and second chip faces 12, 18. A wire lead 24 having a contact end 25 and lateral sides 26 is disposed within the first insulative material 22 in such a manner that contact of the lateral sides 26 with either the first or second chip face 12, 18 may or may not occur. The cube faces 14, 20 of the chips 10, 16, the contact end 25 of the wire lead 24, and the exposed end 23 of the first insulative material 22 define an access plane 30, which is a polished surface at the beginning of the process.

An $O_2$ plasma ash is performed on the access plane 30, to form a recess 32 in the first insulative material 22 at the exposed end 23. The $O_2$ plasma ashing reacts selectively with the organic insulative material 22 causing the formation of the recess 32 primarily in the first insulative material 22. This step obviates the need for either etching, and therefore degrading, the silicon chips themselves or all the steps in photolithographically etching a via while still allowing the chips to be stacked without any interstitial layers of appreciable thickness.

The entire access plane 30 is then coated with a 1–2 μm layer of a second insulative material 34, preferably $SiO_2$ or tetraethyl ortho-silicate ("TEOS"), using low temperature, i.e. less than or equal to about 350° C., conformal materials, by a chemical vapor deposition process. The deposition of the second insulative material 34 is generally conformal in nature, as shown in FIG. 1C, and therefore leaves the thickness of the second insulative material 34 over the contact end 25 of the wire lead 24 approximately equal to the thickness of the second insulative material 34 over the cube faces 14, 20 of the chips 10, 16. The temperature of deposition should preferably not exceed 350° C., to be consistent with the highest cube process temperature in the current processes of record.

Once the second insulative material 34 has been deposited, the cube is chemically-mechanically polished ("CMP") briefly in a standard, controllable fashion using a qualified $SiO_2$ slurry and a soft pad. The CMP operation is optimized and controlled to terminate when the contact end 25 of the wire lead 24 is cleared of the second insulative material 34, but prior to uncovering the cube faces 14, 20 of the integrated circuit chips 10, 16. This process leaves the contact end 25 of the wire lead 24 flush with the surface of the surrounding substrate, as shown in FIG. 1D, thereby reducing the likelihood of problems with metallization coverage.

An alternative process of producing the semi-conductor device 8 of this invention is shown in a stepwise manner in FIG. 2A–D. As shown in FIG. 2A, there are provided a first integrated circuit chip 10 having a first chip face 12 and a first cube face 14, a second integrated circuit chip 16 having a second chip face 18 and a second cube face 20, a first insulative material 22 having an exposed end 23 disposed between the first and second chip faces 12, 18, and a wire lead 24 having a contact end 25 and lateral sides 26 disposed within the first insulative material 22 in such a manner that contact of the lateral sides 26 with either the first or second chip face 12, 18 may or may not occur. The cube faces 14, 20 of the chips 10, 16, the contact end 25 of the wire lead 24, and the exposed end 23 of the first insulative material 22 define an access plane 30, which is a polished surface at the beginning of the process, as with the first embodiment of this invention.

FIG. 2B is a fragmentary cross-section of the semi-conductor device 8 after the first insulative material 22 has been etched away. The etching is accomplished in the same manner as described above on the access plane 30 of the first insulative material 22. The $O_2$ ash, as described above, is performed to form the recess 32, which is several microns in depth, like the recess 32 shown in FIG. 1B.

The entire access plane 30 is then coated with a 1–2 μm layer of a second insulative material 34, which is applied by a spin-apply technique as is known in the art. The second insulative material 34 in this embodiment should be a polyimide or some other semi-planarizing material in order to create a coating that is thicker over the cube faces 14, 20 and first insulative material 22 than it is over the contact end 25 of wire lead 24, consistent with known planarization behavior over an isolated structure, as is shown in FIG. 2C.

Following the apply, if the second insulative material 34 is a polyimide, then the polyimide is baked to a temperature of 150°–160° C. using a hot-plate or an oven, so that the wet develop rate of the polyimide can be controlled in a basic developer solution, for example 5% tetramethyl ammonium hydroxide ("TMAH"). The developer is used to controllably remove the polyimide film in order to first expose the contact end 25 of wire lead 24, well before exposing the cube faces 14, 20 of the chips 10, 16 resulting in the structure shown in FIG. 2D. The key variables in optimization of this method include: polyimide apply film thickness; recess depth; bake temperature/time; and developer type, concentration, and immersion time.

Figure 3B:
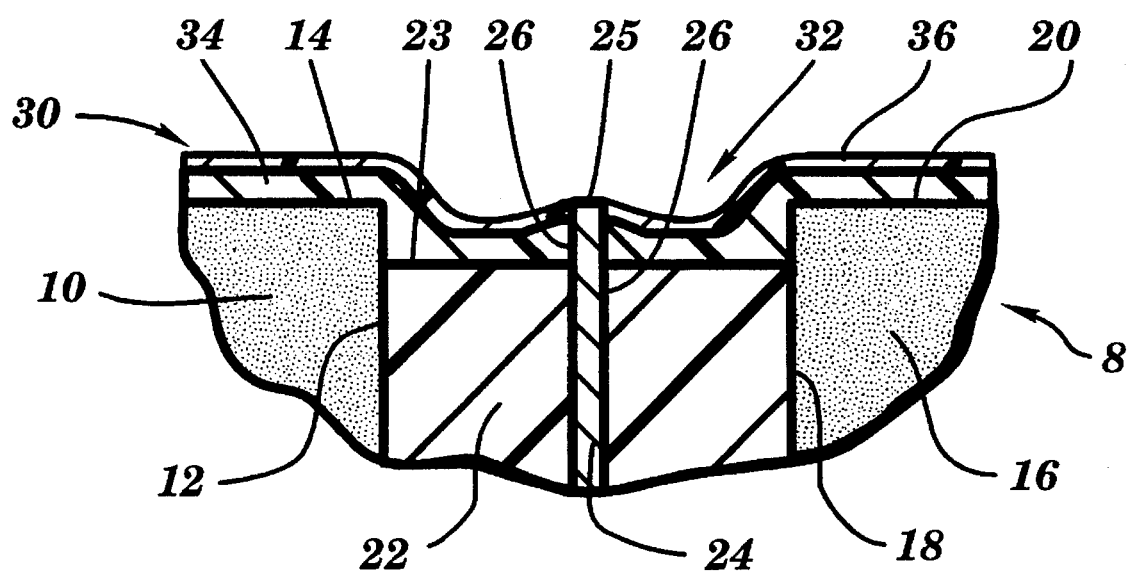
FIG. 3B is a fragmentary, cross-sectional view of the semi-conductor device of the present invention after the application of a second layer of the second insulative material has been applied.

Occasionally, the variables of the above method may change resulting in the situation where the lead 24 extends above the level of the surrounding second insulative material 34, thereby exposing the lateral sides 26, as shown in FIG. 3A. In order to solve this problem, a third insulative material 36 may be spin-applied as shown in FIG. 3B. The third insulative material 36 is preferably the same material as the second insulative material 34, most preferably polyimide. This layer 36 may either be applied in a thin enough film so as to not cover the contact end 25 of the wire lead 24 or, if it does, the newly applied material 36 is selectively and controllably ashed just sufficiently to re-expose the contact end 25 of the wire lead 24.

While the invention has been particularly shown and described with reference to preferred exemplary embodi-

We claim:

1. A method of exposing a conductive lead disposed within a first insulative material of a semi-conductor device, the first insulative material being disposed between a first integrated circuit chip having a first cube face, and a second integrated circuit chip having a second cube face, said conductive lead, first insulative material and cube faces defining a plane, said method comprising the step of:

selectively etching the insulative material to expose the lead without substantially etching the chips.

2. The method according to claim 1 wherein the step of selectively etching is an $O_2$ plasma ashing process.

3. The method according to claim 1 further comprising the step of:

depositing a second insulative material onto an access plane of the semi-conductor device.

4. The method according to claim 3 wherein the second insulative material is spin-applied and wherein the second insulative material is semi-planarizable.

5. The method according to claim 4 further comprising the steps of:

baking said semi-conductor device to set the second insulative material; and developing the second insulative material to remove the second insulative material from the contact end of said conductive lead without completely removing the second insulative material from the cube faces of the chips.

6. The method according to claim 4 wherein the second insulative material is a polyimide.

7. The method according to claim 5 further comprising the step of:

spin-applying a third insulative material.

8. The method according to claim 3 wherein the second insulative material is a low-temperature, conformal material.

9. The method according to claim 8 wherein the second insulative material is selected from the group consisting of $SiO_2$ and TEOS.

10. The method of claim 3 further comprising the step of:

chemically-mechanically polishing said second applied insulative material, and terminating said chemical-mechanical polishing when the lead is exposed but the chip surfaces are still covered with said second applied insulative material.

11. The method of claim 10 wherein the chemical-mechanical polish is performed using a qualified $SiO_2$ slurry and a soft pad.

* * * * *